(12) United States Patent
Lai et al.

(10) Patent No.: US 6,468,867 B1
(45) Date of Patent: Oct. 22, 2002

(54) METHOD FOR FORMING THE PARTIAL SALICIDE

(75) Inventors: Erh-Kun Lai, Taichung (TW);
Hsin-Huei Chen, Miao-Li (TW);
Ying-Tso Chen, Kaohsiung (TW);
Shou-Wei Hwang, Chilung (TW);
Yu-Ping Huang, Taichung (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 09/916,267

(22) Filed: Jul. 30, 2001

(51) Int. Cl.[7] .................. H01L 21/8234; H01L 21/8242
(52) U.S. Cl. .................. 438/275; 438/241; 438/279
(58) Field of Search ................................ 438/275, 279, 438/241, 200, 258, 587

(56) References Cited

U.S. PATENT DOCUMENTS 6,025,267 A * 2/2000 Pey et al. .................. 438/299
6,133,096 A * 10/2000 Su et al. .................. 438/257
6,153,476 A * 11/2000 Inaba et al. .................. 438/275
6,277,683 B1 * 8/2001 Pradeep et al. ............. 438/200
6,383,878 B1 * 5/2002 Huang ........................ 438/258
6,395,596 B1 * 5/2002 Chien et al. ................. 438/241
6,403,417 B1 * 6/2002 Chien et al. ................. 438/275

* cited by examiner

Primary Examiner—Michael Trinh (57) ABSTRACT

This invention relates to a method for forming the salicide, more particularly, to the method for forming the salicide in the partial region. The present invention uses a nitride layer to be the mask layer to form the salicide in the partial region of the logic circuit. The silicide is formed on the gate and is not formed in the diffusion region, which are in the cell array region. The silicide is formed on the gate and in the diffusion region, which are in the periphery region. The present invention method can make the semiconductor device obtain lower resistance and decrease the leakage defects.

18 Claims, 8 Drawing Sheets

METHOD FOR FORMING THE PARTIAL SALICIDE

BACKGROUND OF THE INVENTION

1. Field of the Invention

This invention relates to a method for forming the salicide, more particularly, to the method for forming the salicide in the partial region to form the silicide on the gates which are in the periphery region and cell array region, and in the diffusion n region which is in the e periphery region. The present invention method can make the semiconductor device obtain lower resistance and decrease the leakage defects.

2. Description of the Prior Art

An increment in device integrity makes the resistance of metal oxide semiconductor (MOS) device source/drain regions gradually climb up and almost equal to the resistance of MOS device channel. In order to reduce the sheet resistance of source/drain regions and to guarantee a complete shallow junction between metal and MOS device, the application of a "Self aligned Silicide" process is gradually steeping into the very large scale integration (VLSI) fabrication of 0.5 micron ($\mu$m) and below. This particular process is called "Salicide" for short.

Figure 1:
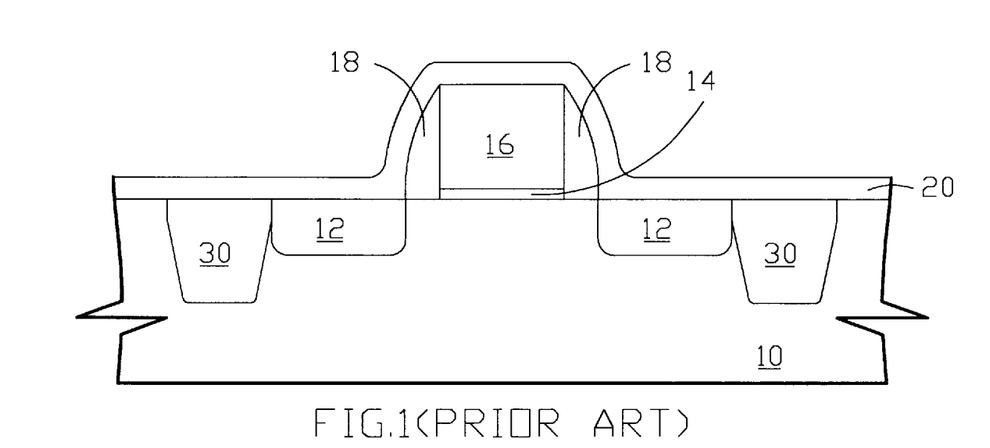
FIG. 1 shows a diagram in forming a titanium layer over the MOS by using the traditional technology.
Figure 2:
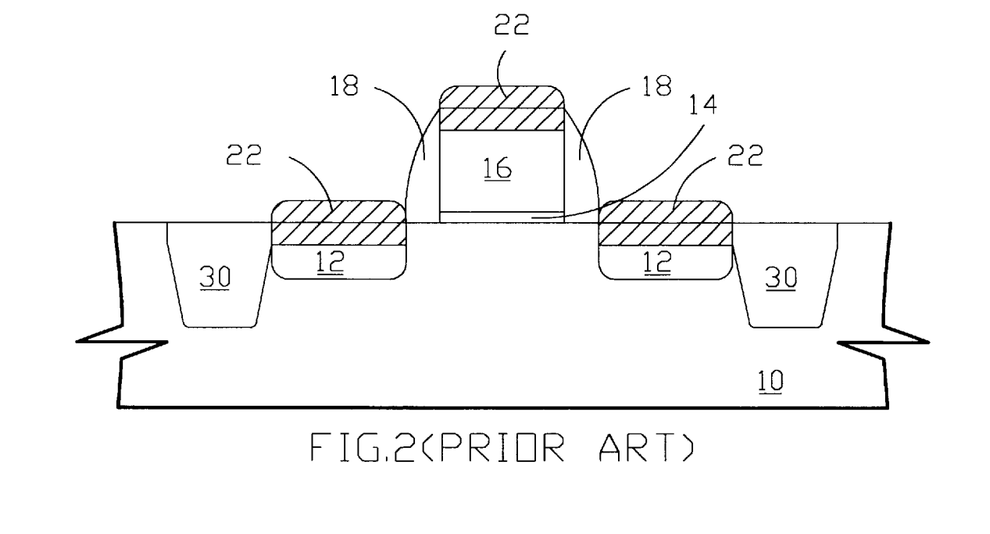
FIG. 2 shows a diagram in forming a titanium silicide layers on the gate region and source/drain region by using the traditional technology.

In general, the titanium silicon is usually used in silicide. The titanium silicide is formed to use two sequence steps r rapid thermal process. At first, referring to FIG. 1, a silicon substrate 10 is provided and a MOS device and a shallow trench isolation are formed thereon. The MOS device comprises a source/drain region 12 a gate region, and as well as a spacer 18 formed on the sidewalls of the gate region. This gate region comprises a gate oxide layer 14 and a polysilicon layer 16, then using the chemical vapor deposition technique or the magnetron direct current sputtering technique to deposit a titanium metal layer 20 over the MOS and the shallow trench isolation. The thickness of the titanium metal layer 20 is about more than 300 angstroms. Next, a rapid thermal process is performed, wherein part of the titanium metal layer will react with the silicon on the source/drain region and with the polysilicon of the gate region to form a titanium silicide layer. The thickness of this titanium silicide layer is about 600 to 700 angstroms. The structure of this titanium silicide layer is a metastable C-49 phase structure with higher resistivity. Referring to FIG. 2, the unreacted titanium metal and the remained titanium metal are removed by applying the RCA cleaning method. Therefore, the titanium silicide layer 22 is existed on top of the gate region and the source/drain region. Finally, a rapid thermal process is performed again to transform higher resistivity of the C-49 phase titanium silicide structure into lower resistivity of the C-54 phase titanium silicide structure.

In the deep sub-micron device fabrication, the decline of the device driving current that cause by parasitic seties resistance of source/drain can be avoided by siliciding the source/drain. The above can be accomplished by either using simple silicidation of source/drain or self-aligned silicidation, where self-aligned silicidation can accomplish the silicidations of source/drain and gate region at the same time.

In the present logic circuit, the silicide is also needed to be used to decrease the resistance of the conductive layer and to increase the qualities of the semiconductor device. In order to cooperate the operation of the logic circuit, the partial region of the logic circuit will not be formed with the silicide to prevent the leakage defects producing on the semiconductor device. In the traditional salicide process, the silicide is formed on the partial material, which need to form silicide, by using complex steps. In the present semiconductor process, the process efficiency is important. The traditional complex steps, which need more time, are not suitable for the present semiconductor process. The present invention method must be used to increase the efficiency of the process.

SUMMARY OF THE INVENTION

In accordance with the above-mentioned invention backgrounds, the traditional method can not form the silicide in the partial region of the logic circuit quickly. The main object of the present invention is to decrease the resistance of the word line, which is in the cell array region and periphery region, by using a nitride layer to be the mask layer to form the silicide on the gates, which are in the cell array region and the periphery region, and in the diffusion region, which is in the periphery region successfully.

The second objective of this invention is to avoid the leakage defects occurring in the diffusion region, which is in the cell array region, by using a nitride layer to be the mask layer to form the silicide on the gates, which are in the cell array region and the periphery region, and in the diffusion region, which is in the periphery region successfully.

The third objective of this invention is to decrease the resistance of the periphery region by using a nitride layer to be the mask layer to form the silicide on the gates, which are in the cell array region and the periphery region, and in the diffusion region, which is in the periphery region successfully.

The fourth objective of this invention is to increase the quality of the semiconductor device by using a nitride layer to be the mask layer to form the silicide on the gates, which are in the cell array region and the periphery region, and in the diffusion region, which is in the periphery region successfully.

It is a further objective of this invention to increase the proceeding efficiency of the semiconductor device process by using a nitride layer to be the mask layer to form the silicide on the gates, which are in the cell array region and the periphery region, and in the diffusion region, which is in the periphery region successfully.

In according to the foregoing objectives, the present invention provides a method to decrease the resistance of the word line, which is in the cell array region and periphery region and to avoid the leakage defects occurring in the diffusion region, which is in the cell array region, by using a nitride layer to be the mask layer to form the silicide on the gates, which are in the cell array region and the periphery region, and in the diffusion region, which is in the periphery region successfully. The present invention method can also decrease the resistance of the periphery region. The present invention method can further increase the quality of the semiconductor device and increase the proceeding efficiency of the semiconductor device process.

BRIEF DESCRIPTION OF THE DRAWINGS

In the accompanying drawing forming a material part of this description, there is shown.

DESCRIPTION OF THE PREFERRED EMBODIMENT

The foregoing aspects and many of the attendant advantages of this invention will become more readily appreciated as the same becomes better understood by reference to the following detailed description, when taken in conjunction with the accompanying drawings, wherein:

The semiconductor devices, which are in the logic circuit, are interconnected by using the word line and the bit line. The objective of the word line is to define the location of the signals and the objective of the bit line is to judge the types of the signal. Therefore, the word line connects with the gate of the semiconductor device and the bit line connects with the source/drain region of the semiconductor device. Regarding to the word line, it needs higher transmission rate to transmit the data. Therefore, a silicide is formed on the word line and on the gates of the semiconductor device to decrease the resistance of the word line and to increase the transmission rate of the word line by using the present invention method.

The logic circuit is divided into two major region, one is cell array region, the other is periphery region. The function of the cell array region is to save the data in an electric charge mode to the memory device which is in the cell array region. The function of the periphery region is to transmit and to compute the data by using the devices, which are in the periphery region, such as the adder, to treat the data. The data will be transmitted to other regions by using the periphery region after the data is treated. Therefore, the devices which are in the cell array region must be independent with each other to prevent the short circuit defects, which will lost the data. The devices which are in the periphery region must be interconnected with each other to increase the treating rate of the data. This shows that the present invention method must be used to form the silicide on the gate and the diffusion region of the periphery region, to form the silicide on the gate of the cell array region, and to avoid forming the silicide on the diffusion region of the cell array region. This condition will increase the data transmitting ability of the periphery region and prevent the short circuit defects, which will lost the data, occurring in the cell array region.

Figure 3:
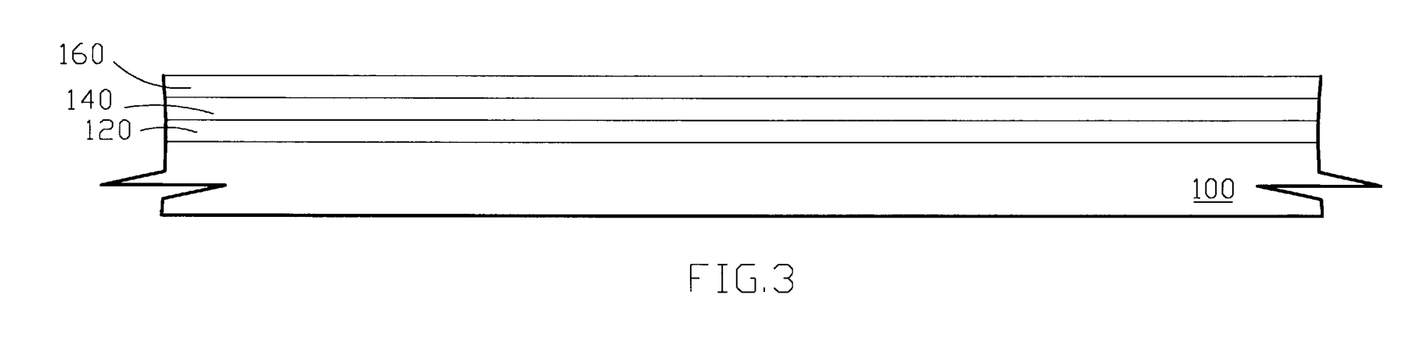
FIG. 3 shows a diagram in forming the first oxide layer, nitride layer, and the second oxide layer on the substrate.

Referring to FIG. 3, a wafer, which comprises a substrate 100, is provided at first and the first oxide layer 120 is formed on the substrate 100. Then the first nitride layer 140 is formed on the first oxide layer 120 and the second oxide layer 160 is formed on the first nitride layer 140 at last. The thickness of the first oxide layer 120 is usually about 70 to 90 angstroms, the thickness of the first nitride layer 140 is usually about 60 to 80 angstroms, and the thickness of the second oxide layer 160 is usually about 60 to 80 angstroms. In the present process, the thickness of the of the first oxide layer 120 is 80 angstroms, the thickness of the first nitride layer 140 is 70 angstroms, and the thickness of the second oxide layer 160 is 70 angstroms. Following the width of the process is shorter and shorter, the thickness of the first oxide layer 120, the first nitride layer 140, and the second oxide layer 160 will be decreased to conform to the needs of the process.

Figure 4:
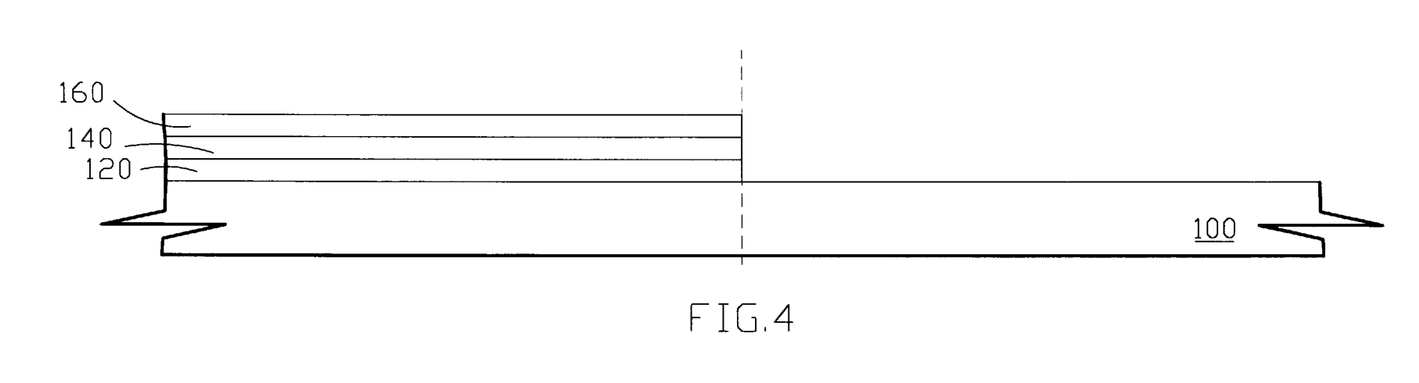
FIG. 4 shows a diagram in removing the first oxide layer, nitride layer, and the second oxide layer which are in the periphery region.
Figure 5:
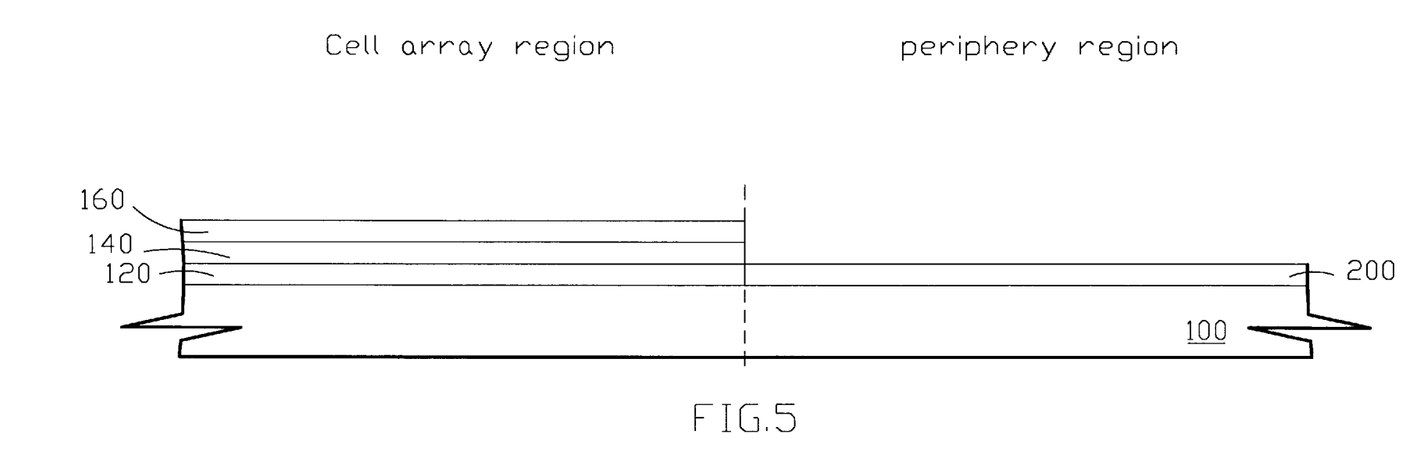
FIG. 5 shows a diagram in forming the third oxide layer on the substrate which is in the periphery region.

Referring to FIG. 4, after deciding the cell array region and the periphery region on the wafer, the first oxide layer 120, the first nitride layer 140, and the second oxide layer 160 which are in the periphery region are removed by a photolithography and a etching process to show the substrate in the periphery region. Referring to FIG. 5, the third oxide layer 200 is formed on the substrate 100 which is in the periphery region. The thickness of the third oxide layer 200 is usually about 40 to 60 angstroms. In the present process, the thickness of the third oxide layer 200 is 50 angstroms. But following the width of the process is shorter and shorter, the thickness of the third oxide layer 200 will be decreased to conform to the needs of the process. The silicon dioxide ($SiO_2$) is usually used to be the material of the first oxide layer 120, the second oxide layer 160, and the third oxide layer 200. The silicon nitride is usually used to be the material of the first nitride layer 140.

In the embodiment, the different forms dielectric layers are formed on the substrate, which is in the cell array region and the periphery region. The oxide/nitride/oxide sandwich form dielectric layer is formed on the substrate in the cell array region. The oxide layer is formed on the substrate in the periphery region to be the dielectric layer. Following the different needs of the process, the cell array region and the periphery region can use the same form dielectric layer which is formed on the substrate to keep the efficiency of the semiconductor devices. The same form dielectric layer can be the oxide layer.

Figure 6:
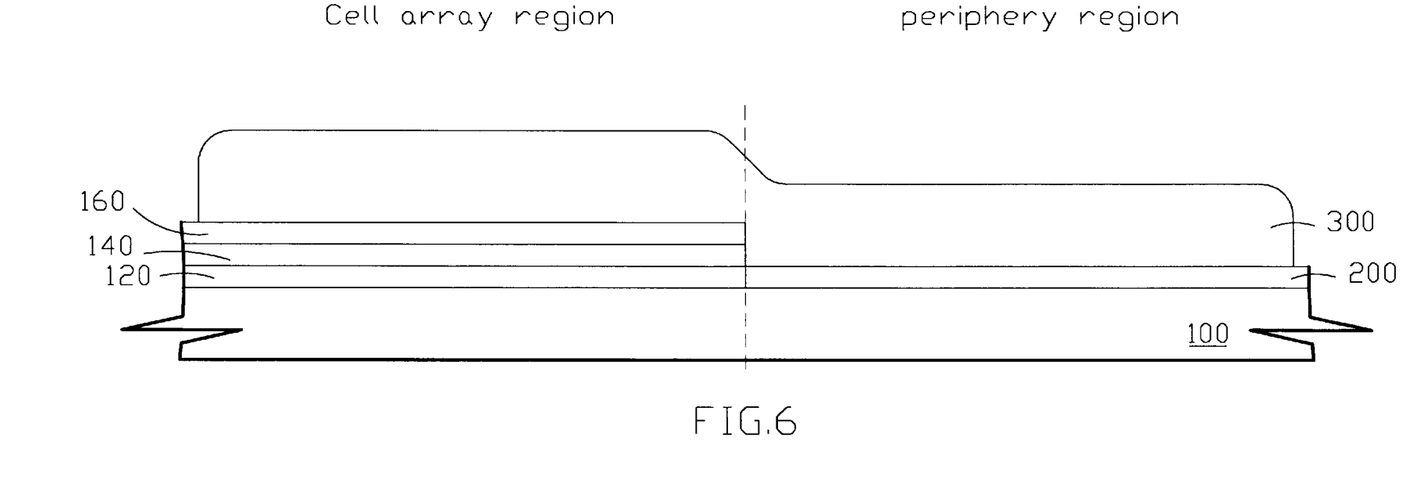
FIG. 6 shows a diagram in forming a silicon layer on the second oxide layer and the third oxide layer.
Figure 7:
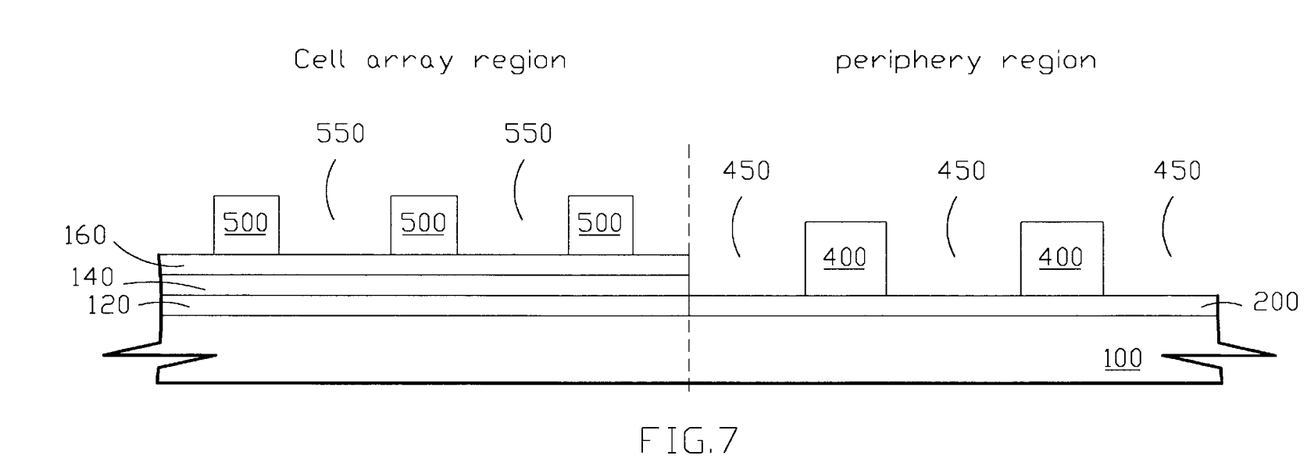
FIG. 7 shows a diagram in forming the plural first gates and the plural first diffusion regions in the periphery region and forming the plural second gates and the plural second diffusion regions in the cell array region.

Referring to FIG. 6, a silicon layer 300 is formed on the second oxide layer 160 and the third oxide layer 200. The silicon layer 300 is a gate layer. Referring to FIG. 7, after deciding the location of the gates which are in the periphery region and cell array region, the partial silicon layer is removed by using a photolithography and a etching process to form the plural first gates 400 and the plural first diffusion regions 450 in the periphery region and to form the plural second gates 500 and the plural second diffusion regions 550 in the cell array region. The plural first diffusion regions 450 are located on the both sides of the plural first gates 400 and the plural second diffusion regions 550 are located on the both sides of the plural second gates 500.

Figure 8:
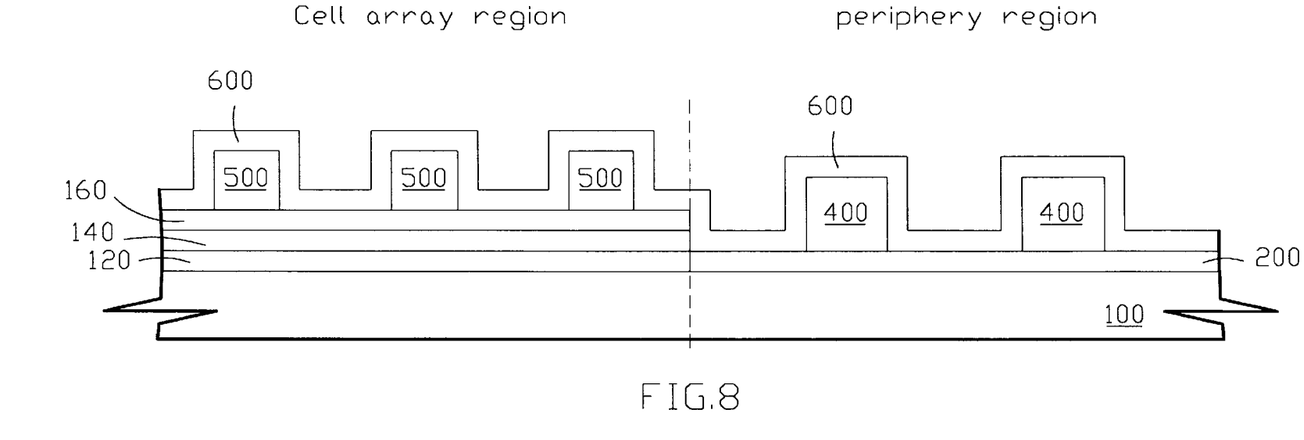
FIG. 8 shows a diagram in forming the second nitride layer on the plural first gates, the plural first diffusion regions, the plural second gates, and the plural second diffusion regions.

Referring to FIG. 8, the second nitride layer 600 is formed on the plural first gates 400, the plural first diffusion regions 450, the plural second gates 500, and the plural second diffusion regions 550. The material of the second nitride layer 600 is silicon nitride. The thickness of the second nitride layer 600 is usually about 700 to 900 angstroms. In the present process, the thickness of the second nitride layer 600 is 800 angstroms. But following the width of the process is shorter and shorter, the thickness of the second nitride layer 600 will be decreased to conform to the needs of the process.

Figure 9:
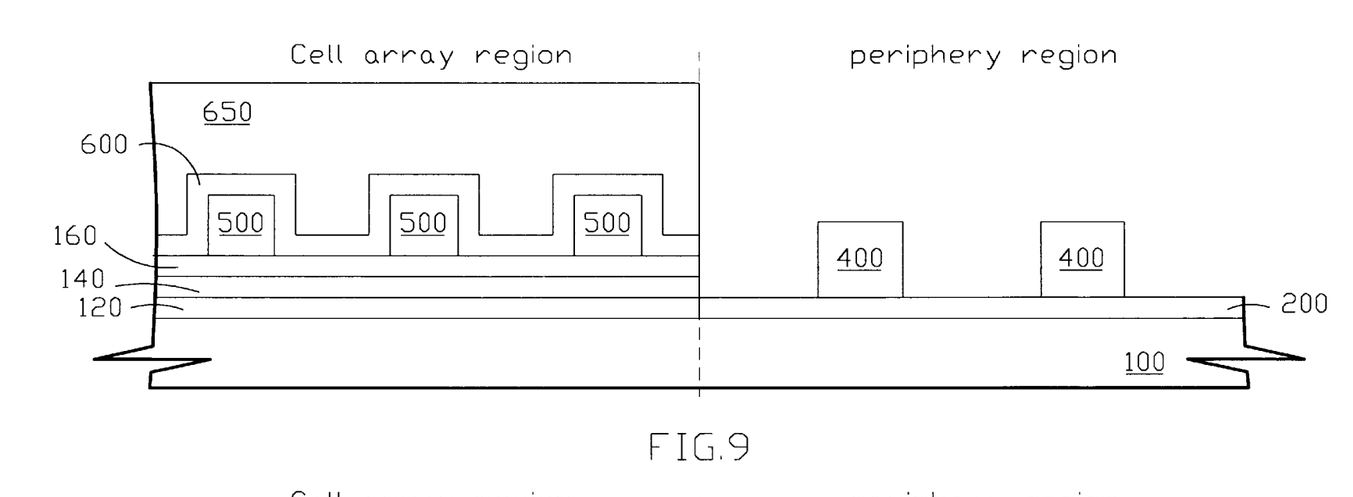
FIG. 9 shows a diagram in removing the second nitride layer which is in the periphery region and forming a mask layer on the second nitride layer which is in the cell array region.

Referring to FIG. 9, a mask layer 650 is formed on the second nitride layer 600 which is in the cell array region and the second nitride layer 600 which is in the periphery region is removed to show the plural first gates 400 and the plural first diffusion regions 450. The dry-etching method is usually used to remove the second nitride layer 600 which is in the periphery region.

Figure 10:
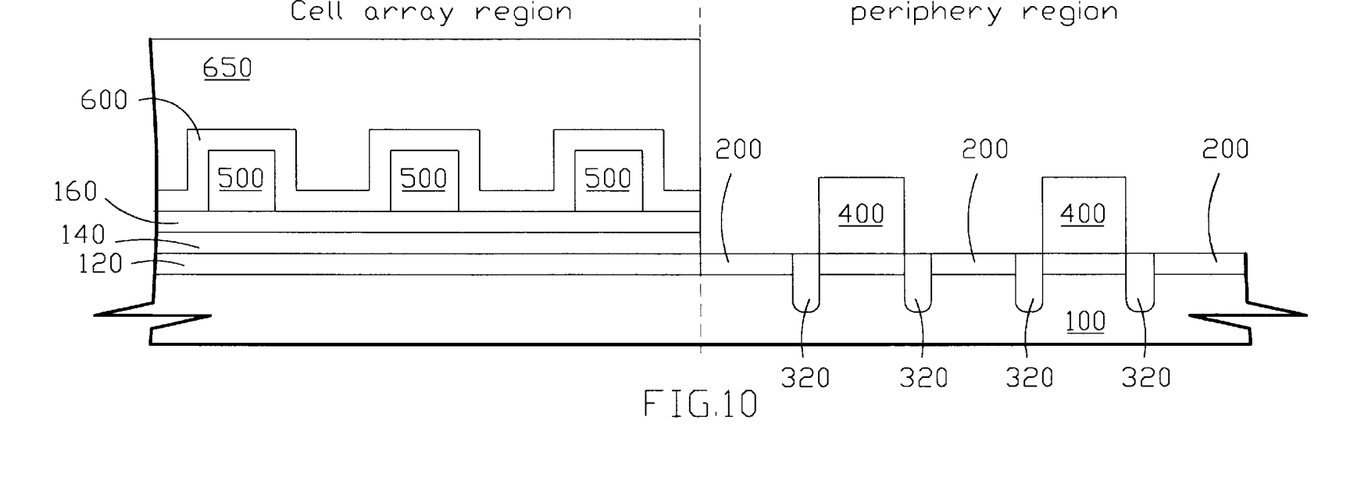
FIG. 10 shows a diagram in forming the lightly doped drain (LDD) in the plural first diffusion regions.
Figure 11:
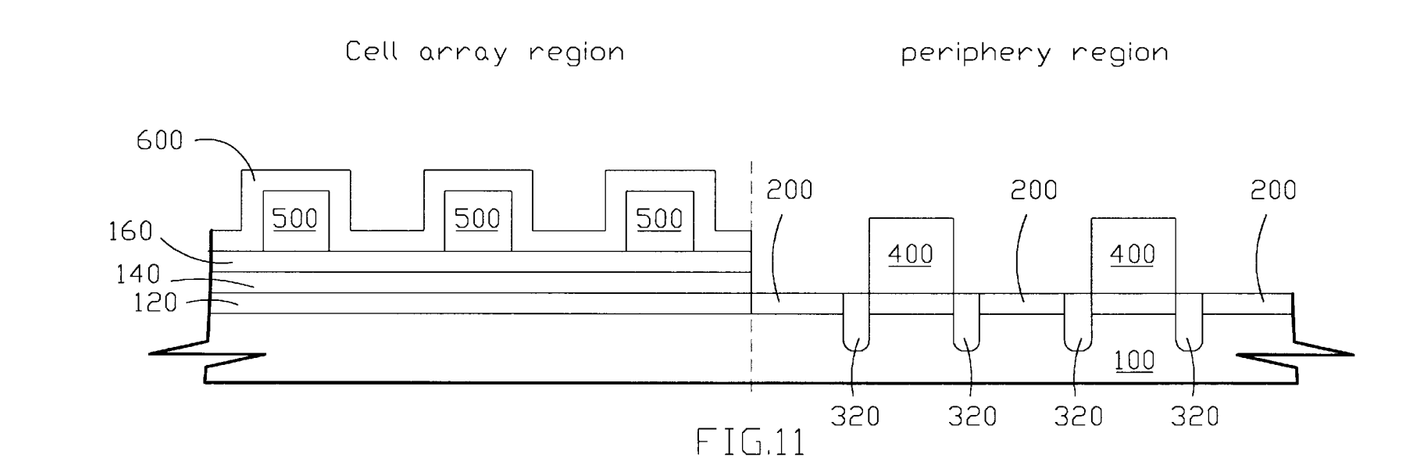
FIG. 11 shows a diagram in removing the mask layer to show the plural second gates and the plural second diffusion regions which are in the cell array region.

Referring to FIG. 10, the lightly doped drain (LDD) is proceed to form the lightly doped drain region 320 in the plural first diffusion regions 450. The objective of this process is to decrease the hot carrier effects. Referring to FIG. 11, the mask layer 650 is removed to show the second nitride layer 600 in the cell array region.

Figure 12:
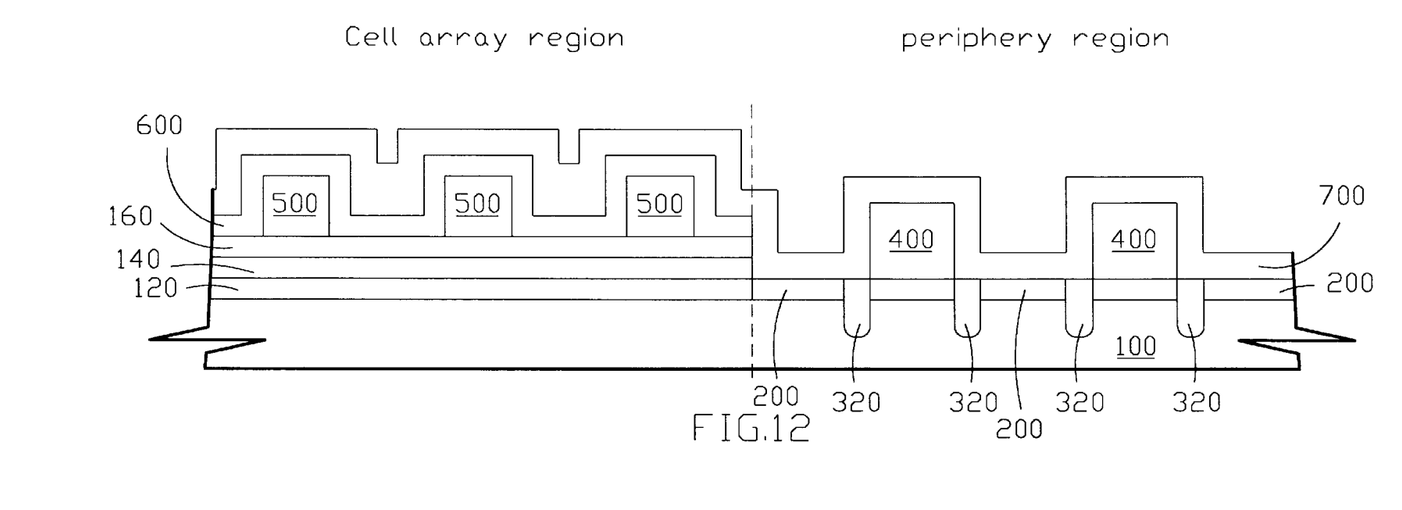
FIG. 12 shows a diagram in forming the third nitride layer on the plural first gates, the plural first diffusion regions, and the second nitride layer which is in the cell array region.
Figure 13:
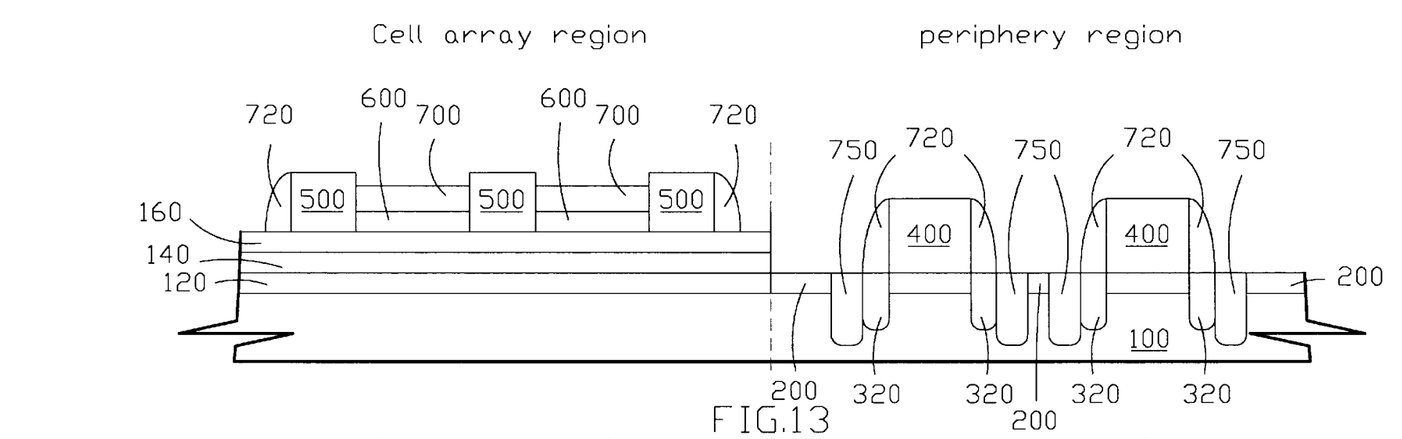
FIG. 13 shows a diagram in removing the partial third nitride layer and the partial second nitride layer to form the spacer on the sidewalls of the plural first gates, showing the silicon layer on the top of the plural first gates and the plural second gates, and showing the third oxide layer in the plural first diffusion regions at the same time.

Referring to FIG. 12, the third nitride layer 700 is formed on the second nitride layer 600 which is in the cell array region, the plural first gates 400, and the plural first diffusion regions 450. The material of the third nitride layer 700 is usually as same as the material of the second nitride layer 600 in silicon nitride. The thickness of the third nitride layer 700 and the second nitride layer 600, which are formed on the plural first diffusion regions 450 is thicker than the thickness of the third nitride layer 700 and the second nitride layer 600 which are formed on the plural first gates 400. Therefore, in the back-end process to remove the third nitride layer 700 and the second nitride layer 600 which are formed on the plural first gates 400, the nitride layer is still remained on the plural first diffusion region 450 to prevent the metal silicide layer being formed on the plural first diffusion regions 450. Referring to FIG. 13, the partial third nitride layer 700 or the mixture which comprises the partial third nitride layer 700 and the partial second nitride layer 600 is removed to form the spacer 720 on the sidewalls of the plural first gates. This step can also show the silicon layer 300 on the top of the plural first gates 400 and the plural second gates 500 and show the third oxide layer 200 on the top of the plural first diffusion regions 450 at the same time. Then the ions which are needed in the process are implanted into the plural first diffusion regions to form the source/drain regions 750.

Figure 14:
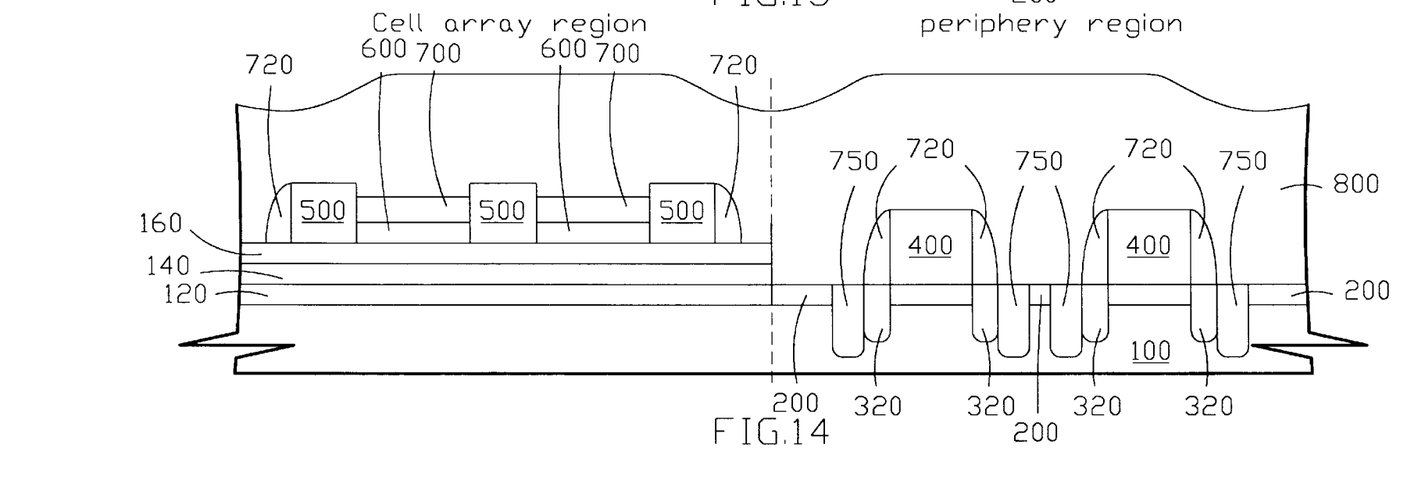
FIG. 14 shows a diagram in forming a metal layer on the plural first gates, the plural first diffusion regions, the plural second gates, and the third nitride layer which is in the cell array region.
Figure 15:
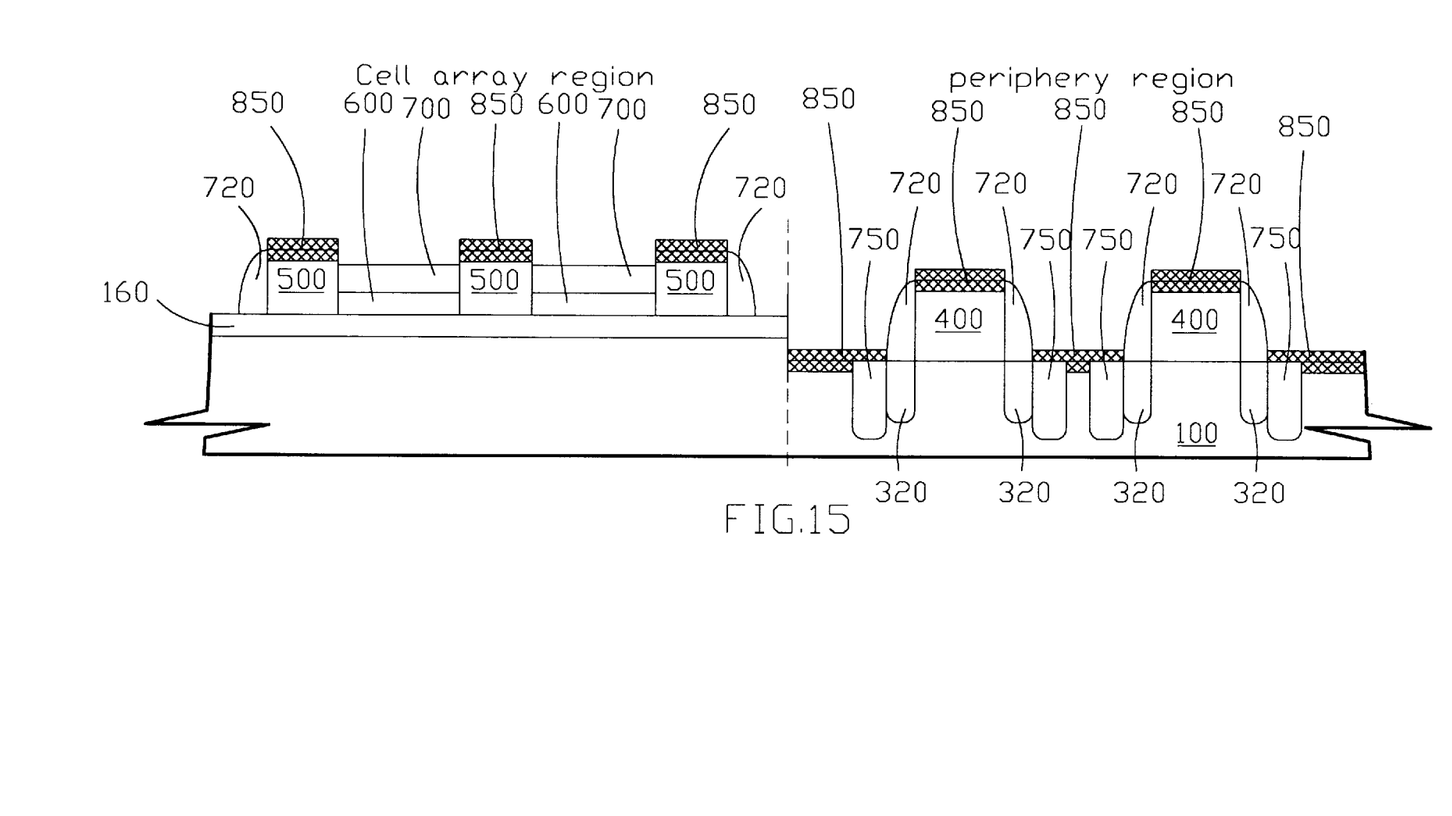
FIG. 15 shows a diagram in forming a silicide layer on the plural first gates, the plural first diffusion regions, and the plural second gates.

Referring to FIG. 14, the metal layer is formed on the third nitride layer 700 which is in the cell array region, the plural first gates 400, the plural first diffusion regions 450, and the plural second gates 500. Before the metal layer 800 deposition process, the wet etching method is used to clean the oxide which is on the silicon layer and the plural first diffusion regions to form the metal silicide layer easier. The chemical vapor deposition method or the direct current magnetron sputtering method is most used to form the metal layer 800. Then the wafer is placed into the chamber to proceed the first rapid thermal process (RTP). The metal layer 800 will react with the silicon, which is at the contact region, to form the silicide layer. The using temperature of the silicide process is about 500 to 700° C. The structure of the metal silicide which is formed in the first rapid thermal process is a metastable C-49 phase structure with higher resistivity. Referring to FIG. 15, the unreacted and the remained metal layer 800 is removed by applying the RCA cleaning method. Therefore, the silicide layers 850 are existed on the top of the plural first gates 400, the plural first diffusion regions 450, and the plural second gates 500. Finally, the second rapid thermal process is performed to transform higher resistivity of the C-49 phase silicide structure into lower resistivity of the C-54 phase silicide structure. The using temperature of the second rapid thermal process is about 750 to 850° C. The material of the metal layer 800 can be titanium, cobalt, and platinum. Titanium is usually used to be the material of the metal layer 800.

Titanium is the most common used metallic material for the current salicide process. Basically, titanium is a fine oxygen gettering material, where under an appropriate temperature titanium and silicon at MOS device source/drain and gate regions are easily mutually diffused to form a titanium silicide with very low resistance.

Because the nitride layer can not react with the metal layer to form the silicide layer, the second nitride layer 600 or the mixture, which comprises the third nitride layer 700 and the partial second nitride layer 600, which is remained in the plural second diffusion regions 550 after the spacer 720 process will used to be a mask layer in the back-end silicide process to protect the plural second diffusion region 550 and to avoid the silicide layer to be formed in the plural second diffusion region 550. The plural second gates will not be interconnected with each other to cause the leakage defects in the cell array region. Therefore, the objective of the third nitride layer 700 is to form the spacer 720 on the sidewalls of the plural first gates 400 and to increase the thickness of the mask layer which is on the top of the plural second diffusion region 550 to avoid the leakage defects.

In accordance with the present invention, the present invention provides a method to decrease the resistance of the word line, which is in the cell array region and periphery region and to avoid the leakage defects occurring in the diffusion region, which is in the cell array region, by using a nitride layer to be the mask layer to form the silicide on the gates, which are in the cell array region and the periphery region, and in the diffusion region, which is in the periphery region successfully. The present invention method can also decrease the resistance of the periphery region. The present invention method can further increase the quality of the semiconductor device and increase the proceeding efficiency of the semiconductor device process.

Although specific embodiments have been illustrated and described, it will be obvious to those skilled in the art that various modifications may be made without departing from what is intended to be limited solely by the appended claims.

What is claimed is:

1. A method for forming a partial salicide, said method comprises:

providing a wafer, wherein said wafer comprises a substrate;

forming a first oxide layer on said substrate;

forming a nitride layer on said first oxide layer;

forming a second oxide layer on said nitride layer;

removing said partial first oxide layer, said partial nitride layer, and said partial second oxide layer to show said substrate in a first region of said wafer;

forming a third oxide layer on said substrate which is in said first region;

forming a silicon layer on said second oxide layer and said third oxide layer;

removing said partial silicon layer to form a plural first gates and a plural first diffusion regions in said first region and to form a plural second gates and a plural second diffusion regions in a second region of said wafer, wherein said plural first diffusion regions are located on a side of said plural first gates and said plural second diffusion regions are located on a side of said plural second gates;

forming a second nitride layer on said plural first diffusion regions, said plural first gates, said plural second diffusion regions, and said plural second gates;

forming a mask layer on said second nitride layer which is in said second region and removing said second nitride layer which is on said plural first diffusion regions and said plural first gates;

removing said mask layer;

forming a third nitride layer on said plural first diffusion regions, said plural first gates, and said second nitride layer which is in said second region;

removing said partial third nitride layer to form a spacer on a sidewall of said plural first gates, to show said silicon layer on said plural first gates and said plural second gates, and to show said third oxide layer over said plural first diffusion regions;

forming a metal layer on said plural first gates, said plural first diffusion regions, and said plural second gates;

proceeding a rapid thermal process to form a silicide layer on said plural first gates, said plural first diffusion regions, and said plural second gates; and removing said metal layer.

2. The method according to claim 1, wherein said a material of said metal layer is titanium.

3. The method according to claim 1, wherein said a material of said metal layer is cobalt.

4. The method according to claim 1, wherein said a material of said metal layer is platinum.

5. The method according to claim 1, wherein said first region is cell array region.

6. The method according to claim 1, wherein said second region is periphery region.

7. A method for forming a partial salicide, said method comprises:

providing a wafer, wherein said wafer comprises a substrate;

forming a first oxide layer on said substrate;

forming a nitride layer on said first oxide layer;

forming a second oxide layer on said nitride layer;

removing said partial first oxide layer, said partial nitride layer, and said partial second oxide layer to show said substrate in a first region of said wafer;

forming a third oxide layer on said substrate which is in said first region;

forming a silicon layer on said second oxide layer and said third oxide layer;

removing said partial silicon layer to form a plural first gates and a plural first diffusion regions in said first region and to form a plural second gates and a plural second diffusion regions in a second region of said wafer, wherein said plural first diffusion regions are located on a side of said plural first gates and said plural second diffusion regions are located on a side of said plural second gates;

forming a second nitride layer on said plural first diffusion regions, said plural first gates, said plural second diffusion regions, and said plural second gates;

forming a mask layer on said second nitride layer which is in said second region and removing said second nitride layer which is on said plural first diffusion regions and said plural first gates;

forming a lightly doped drain in said plural first diffusion regions;

removing said mask layer;

forming a third nitride layer on said plural first diffusion regions, said plural first gates, and said second nitride layer which is in said second region;

removing said partial third nitride layer to form a spacer on a sidewall of said plural first gates, to show said silicon layer on said plural first gates and said plural second gates, and to show said third oxide layer over said plural first diffusion regions;

forming a metal layer on said plural first gates, said plural first diffusion regions, and said plural second gates;

proceeding a rapid thermal process to form a silicide layer on said plural first gates, said plural first diffusion regions, and said plural second gates; and removing said metal layer and proceeding a second rapid thermal process.

8. The method according to claim 7, wherein said a material of said metal layer is titanium.

9. The method according to claim 7, wherein said a material of said metal layer is cobalt.

10. The method according to claim 7, wherein said a material of said metal layer is platinum.

11. The method according to claim 7, wherein said first region is cell array region.

12. The method according to claim 7, wherein said second region is periphery region.

13. A method for forming a partial salicide, said method comprises:

providing a wafer, wherein said wafer comprises a substrate and said substrate comprises a first region and a second region;

forming a oxide layer on said substrate;

forming a silicon layer on said oxide layer;

removing said partial silicon layer to form a plural first gates and a plural first diffusion regions in said first region and to form a plural second gates and a plural second diffusion regions in a second region of said wafer, wherein said plural first diffusion regions are located on a side of said plural first gates and said plural second diffusion regions are located on a side of said plural second gates;

forming a first nitride layer on said plural first diffusion regions, said plural first gates, said plural second diffusion regions, and said plural second gates;

forming a mask layer on said first nitride layer which is in said second region and removing said first nitride layer which is on said plural first diffusion regions and said plural first gates;

removing said mask layer;

forming a second nitride layer on said plural first diffusion regions, said plural first gates, and said first nitride layer which is in said second region;

removing said partial second nitride layer to form a spacer on a sidewall of said plural first gates, to show said silicon layer on said plural first gates and said plural second gates, and to show said oxide layer over said plural first diffusion regions;

forming a metal layer on said plural first gates, said plural first diffusion regions, and said plural second gates;

proceeding a rapid thermal process to form a silicide layer on said plural first gates, said plural first diffusion regions, and said plural second gates; and removing said metal layer.

14. The method according to claim 13, wherein said a material of said metal layer is titanium.

15. The method according to claim 13, wherein said a material of said metal layer is cobalt.

16. The method according to claim 13, wherein said a material of said metal layer is platinum.

17. The method according to claim 13, wherein said first region is cell array region.

18. The method according to claim 13, wherein said second region is periphery region.

* * * * *